United States Patent [19]

Edelstein et al.

[11] 4,451,788
[45] May 29, 1984

[54] METHODS OF PRODUCING IMAGE INFORMATION FROM OBJECTS

[75] Inventors: William A. Edelstein, Schenectady, N.Y.; James M. S. Hutchison; Glyn Johnson, both of Aberdeen, Scotland; Thomas W. T. Redpath, Stonehaven, Scotland; John R. Mallard, Aberdeen, Scotland

[73] Assignee: National Research Development Corporation, London, England

[21] Appl. No.: 320,951
[22] PCT Filed: Mar. 13, 1981
[86] PCT No.: PCT/GB81/00045
 § 371 Date: Nov. 9, 1981
 § 102(e) Date: Nov. 9, 1981
[87] PCT Pub. No.: WO81/02789
 PCT Pub. Date: Oct. 1, 1981

[30] Foreign Application Priority Data

Mar. 14, 1980 [GB] United Kingdom ............... 8008773

[51] Int. Cl.³ .................................................. G01R 33/08
[52] U.S. Cl. ....................................... 324/309; 324/310
[58] Field of Search ............... 324/309, 310, 311, 313, 324/314

[56] References Cited

U.S. PATENT DOCUMENTS 4,165,479 8/1979 Mansfield ........................... 324/313
4,284,948 8/1981 Young .................................. 324/309
4,290,019 9/1981 Hutchison et al. ................. 324/311

FOREIGN PATENT DOCUMENTS 2833800 12/1979 Fed. Rep. of Germany ...... 324/311

OTHER PUBLICATIONS

Journal of Physics E-Scientific Instruments, vol. 13, No. 9, published Sep. 1980, (London, GB), J. M. S. Hutchison et al., "A Whole-Body NMR Imaging Machine", see pp. 947-948 and FIG. 1.

Primary Examiner—Michael J. Tokar
Assistant Examiner—Kevin D. O'Shea
Attorney, Agent, or Firm—Cushman, Darby & Cushman

[57] ABSTRACT

To produce image information from an object it is subjected to a continuous static magnetic field along a Z axis and to sets of sequences of gradient $G_x$, $G_y$ and $G_z$ to the magnetic field. Spins in a selected plane (the X-Z plane) are excited by selective rf pulses and an associated $G_y$ gradient and the selected spins are subjected to a reversed $G_y$ gradient together with a $G_x$ gradient. The $G_y$ gradient is then switched off and the direction of the $G_x$ gradient is then repeatedly reversed. During the action of reversal of the $G_x$ gradient a small $G_z$ gradient is provided. Each reversed $G_x$ gradient is held constant for a sufficient time for a free induction decay signal to be generated thus providing a multiple echo of the spins in the selected plane. Alternate signals are time-reversed and then both the time-reversed and non time-reversed signals are subject to Fourier transformation.

12 Claims, 1 Drawing Figure

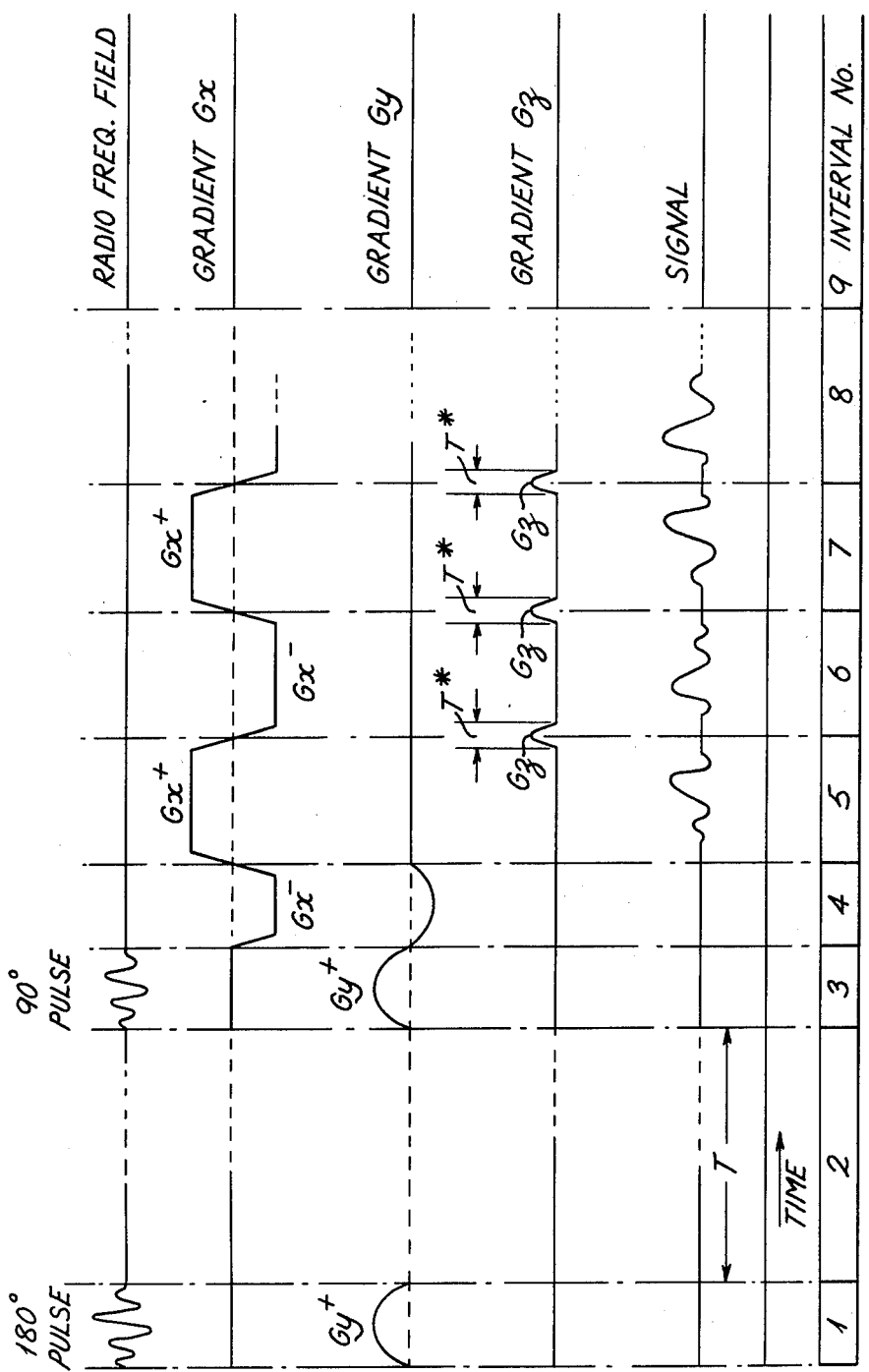

METHODS OF PRODUCING IMAGE INFORMATION FROM OBJECTS

The present invention relates to methods of producing image information from objects. It is concerned with producing images of samples containing nuclear or other spins whose spatial distribution of density or relaxation time is detected by magnetic resonance techniques. More particularly, it describes methods for producing images from free induction decays (FID's) and spin echoes of the sample in the presence of static magnetic fields and switched magnetic field gradients.

It has been proposed in U.S. Pat. No. 4,165,479 that image information can be derived from a series of spin echoes following a single excitation of the sample. The spin echoes are derived by employing switched magnetic field gradients or switched radiofrequency magnetic field pulses. This method may be referred to as the echo planar technique.

The echo planar technique is in some sense an improvement over the method described in U.S. Pat. No. 4,070,611. In the echo planar method imaging information is derived from a number of spin echoes following a single excitation of the sample. The echoes may be produced by successively reversing a magnetic field gradient along one direction. A much smaller gradient at right angles to the first gradient is constantly present to produce a varying phase shift along the second direction which serves the purpose of providing spatial discrimination along the second direction. This technique produces a two-dimensional image in the plane defined by these two gradient directions.

However, the echo planar method as described above seems to have certain difficulties. First, successive echoes produced by the switching of the first gradient mentioned in the previous paragraph must be time reversed with respect to each other. Failure to time reverse successive echo signals before performing the required Fourier transformations will result in mixing up information from the positive and negative directions associated with the first gradient and thus produce aliasing.

Once the necessity for time-reversing successive echoes is appreciated, it becomes evident that the time reversal will be rendered problematic if the second gradient mentioned above is kept on during the signal readout. Consider a small volume element of the sample at co-ordinates (X,Z). Assume that $G_x$ is the first gradient mentioned above and $G_z$ is the second. Then for successive intervals k and (k+1) the successive signals $S_k(X,Z,t)$ and $S_{k+1}(X,Z,t)$ from the element will be $$S_k(X,Z,t) \alpha \exp[i(k-1)\Delta\phi(Z)]\exp[i\gamma(G_xX+G_zZ)(t-t_k)]$$
$$S_{k+1}(X,Z,t) \alpha \exp[i(k-1)\Delta\phi(Z)]\exp[i\Delta\phi(Z)]\exp[i\gamma(-G_xX+G_zZ)(t-t_{k+1})]$$

$\Delta\phi(Z)=\gamma G_z Z\tau$, where $\tau$ is the length of one interval (all N are the same length), and $t_k$ and $t_{k+1}$ are reference times within the intervals k and (k+1). Thus $G_x$ and $G_z$ act in opposite ways in the two signals, and it is not at all clear how to sort out the imaging information in the X and Z directions.

The principal object of the present invention is to provide an improved method of gyromagnetic resonance imaging employing trains of free induction decays and spin echoes.

According to the present invention a method of deriving image information from an object using nuclear magnetic resonance signals comprises subjecting an object to a continuous static magnetic field along an axis and carrying out the following sequence of steps:

(1) exciting nuclear spins in a selected plane,
(2) applying a first gradient of the magnetic field which has a gradient direction parallel to the said plane together with a second gradient of the magnetic field having a gradient direction perpendicular to the said plane.
(3) repeatedly applying the said first gradient with successive reversals of gradient direction, applying a third gradient of the magnetic field which has a gradient direction parallel to the said plane and orthogonal to the direction of the first gradient during each successive reversal of said first gradient, and holding the said first gradient with its successively reversed gradient directions for time intervals during which successive echoing free induction decay signals are read out.

In carrying out the invention alternate free induction decay signals are time-reversed and the time-reversed and non time-reversed free induction decay signals are then subject to Fourier transformation.

In order that the invention may be more fully understood reference will now be made to the accompanying drawings in which the single figure shows pulse sequences for an embodiment of the invention.

For the purpose of the following description a static magnetic field $B_o$ lies along the Z axis and the radiofrequency (rf) field lies along the Y axis. There are coils to produce magnetic field gradients $G_x$, $G_y$ and $G_z$ in the X,Y and Z directions. The production of a two-dimensional image of a thin slab perpendicular to the Y axis is considered. Where the method is applied to human whole body imaging it is convenient to position the patient horizontally with the Z axis vertical and the Y axis along the length of the patient. The X axis then extends across the patient.

The pulse sequence used to form an image from multiple spin echoes following each excitation is shown in the figure. The time axis is divided into nine successive intervals repeated cyclically. The fields which are applied in each of these intervals are as follows:

Interval 1. A 180° rf pulse is applied simultaneously with a magnetic field gradient $G_y^+$. This selectively inverts the nuclear spins in and close to the plane $Y=Y_o$. The value of $Y_o$ can be altered by a change in the frequency of the 180° pulse. Alternatively, a non-selective 180° pulse can be applied with no gradients present. In this case, the y-dimension selection is done entirely by the events in interval 3. Alternatively again, non-selective spin inversion can be obtained by an adiabatic fast passage in which the rf field is swept through a frequency range.

Interval 2. The nuclear spin system is allowed to relax by spin-lattice relaxation for a chosen time T. No fields other than $B_o$ are applied during this interval.

Interval 3. A weak 90° rf pulse is applied simultaneously with a magnetic field gradient $G_y^+$. This selectively excites nuclear spins in and close to the plane $Y=Y_o$. The value of $Y_o$ can be altered by a change in the frequency of the 90° pulse.

Interval 4. A negative magnetic field gradient $G_y^-$ is applied to rephase the nuclear spins along the Y direction. Simultaneously a negative magnetic field gradient $G_x^-$ is applied to dephase the nuclear spins along the X direction.

Interval 5. A positive magnetic field gradient $G_x^+$ is applied during this interval. During this interval, the nuclear spins rephase to form a spin echo, when the free induction signal is a maximum, and then dephase. It is desirable that $G_x^+$ be constant during the signal collection period. Also during this interval is the start of a short positive magnetic field gradient pulse $G_z^+$. This pulse continues into the next interval (interval 6) but only comes on after the signal collection in interval 5 has been completed. The duration of the $G_z^+$ signal is $T^*$, and its purpose is to dephase the spins along the Z direction.

Interval 6. The gradient pulse $G_z^+$ begun in interval 5 is completed. A negative magnetic field gradient $G_x^-$ is applied during this interval. During this interval, the nuclear spins again rephase to form a spin echo, when the free induction signal is a maximum, and then dephase. Again, $G_x^-$ should be constant during signal collection. The collection must begin after the $G_z^+$ pulse begun in interval 5 has been completed. Another short positive magnetic field gradient pulse $G_z^+$ is started at the end of this interval after signal data collection has been completed. The pulse continues into the next interval (interval 7), and its purpose is to dephase the spins along the Z direction.

Interval 7. The gradient pulse $G_z^+$ begun in interval 6 is completed. A positive magnetic field gradient $G_x^+$ is applied during this interval, and another spin echo is formed. Another short gradient pulse $G_z^+$ is begun at the end of this interval after data collection from the signal in this interval.

Interval 8. This interval consists of a number of sub-intervals similar to intervals 5, 6 and 7, in which the gradient $G_x$ is alternately applied positively and negatively and during which a number of spin echoes are formed. Short $G_z^+$ are also applied in the appropriate places.

Interval 9. System recovery time until the occurrence of interval 1 of the next sequence. This should be long compared with the spin-lattice relaxation time $T_1$ and may be of the order of a second in a whole-body NMR imaging machine.

Two different sets of free induction signals $S_A$ and $S_B$, are obtained using this pulse sequence for any one value of the altered high frequency of interval 1 and any particular set of values of $\int_{T^*} dt\, G_z^+$ between intervals 5 and 6, intervals 6 and 7, and so on. $\int_{T^*} dt$ indicates the integral over the time periods lasting $T^*$. $S_B$: The relaxation interval (2) is comparable with the spin-lattice relaxation time being measured. That is, $T \approx T_1$, which is a few hundred milliseconds for human soft tissue at 1.7 MHz. $S_A$: The events of intervals 1 and 2 are omitted, but the rest of the sequence is identical.

$S_A$ sets of signals contain mostly proton density information, and $S_B$ sets of signals contain both spin-lattice relaxation time ($T_1$) information and proton density information.

To obtain an NxN proton density image, N $S_A$ signals must be collected. It may be assumed for the moment that all N required signals are obtained after a single excitation of the sample. Such a complete set could be obtained, for example, by having all the $G_z^+$ identical with the restriction that $$\gamma L_z \int_{T^*} dt\, G_z^+ < 2\pi$$

where $L_z$ is the length of the sample in the Z direction. That is, the spins at the top of the sample must be rotated through a phase angle of at most $2\pi$ relative to the spins at the bottom during each $T^*$ period. N points must be collected from each echo, with due regard for bandwidth requirements.

It might be helpful to consider some of the effects of this sequence on a volume element at co-ordinates (X,Z). For successive intervals k and (k+1) the respective signals $S_k(X,Z,t)$ and $S_{k+1}(X,Z,t)$ are given by $$S_k(X,Z,t) \alpha \exp[i(k-1)\Delta\phi(z)]\exp[i\gamma G_x(t-t_k)]$$
$$S_{k+1}(X,Z,t) \alpha \exp[i(k-1)\Delta\phi(Z)]\exp[i\Delta\phi(Z)]\exp[i\gamma(-G_x)(t-t_{k+1})]$$

where $$\Delta\phi(Z) = Z \int_{T^*} dt\, G_z$$

$t_k$ and $t_{k+1}$ are the reference times within the kth and (k+1)th intervals when the maximum spin echoes occur. Thus if $S_{k+1}$ is time reversed relative to $t_{k+1}$, the x location spatial information (given by the extra precession caused by $G_x$) is exactly the same as in $S_k$. The additional phase shift $\Delta\phi(Z)$ in $S_{k+1}$ compared to $S_k$ enables the spatial distribution in the Z direction to be sorted out, and indeed, the total information available is identical to that obtained in the method described with reference to FIG. 1.

To analyse the data, the N echo signals must be Fourier transformed. However, it is first necessary to time reverse every second signal. A new set of signals can be defined.

$$g_n(\tau) = \begin{cases} f_n(\tau), & n = 2, 4, \ldots, n-2 \cdot n \\ f_n(-\tau), & n = 1, 3, \ldots, n-1 \end{cases}$$

where $f_n(\tau)$ is the nth echo observed at time $\tau$ relative to $t = t_n$. A two-dimensional Fourier transformation is performed on $g_n(\tau)$ to give a final image. An example of such a transformation is given by equation (3) in our concurrent PCT Patent Publication No. WO81/02788, now U.S. Patent Application Ser. No. 320,953, also filed Nov. 19, 1981.

An image containing most $T_1$ information can be obtained by collecting $S_B$ sets of echo signals along with $S_A$ sets of echo signals, deriving an $S_A$ image array and an $S_B$ image array as outlined above, and calculating the $T_1$ values (from these arrays) corresponding to each imaging element. An image containing a mixture of $T_1$ information and proton density information can be obtained from $S_B$ sets of echo signals alone.

The complete set of N echoes necessary to produce an image need not be collected in a single pulse train. Partial sets can be collected after separate excitations, with appropriate adjustments to the values of $\int_{T^*} dt\, G_z^+$ to produce the desired phase shifts along Z for that particular set of echoes.

We claim:

1. A method of deriving image information from an object using nuclear magnetic resonance signals comprising subjecting an object to a continuous static magnetic field along an axis and carrying out the following sequence of steps:
   (1) exciting nuclear spins in a selected plane,
   (2) applying a first gradient of the magnetic field which has a gradient direction parallel to the said plane together with a second gradient of the magnetic field having a gradient direction perpendicular to the said plane, (3) repeatedly applying the said first gradient with successive reversals of gradient direction, applying the third gradient of the magnetic field which has a gradient direction parallel to the said plane and orthogonal to the direction of the first gradient during each successive reversal of said first gradient, and holding the said first gradient with its successively reversed gradient directions for time intervals during which successive echoing free induction decay signals are read out.

2. The method as claimed in claim 1 in which alternate free induction decay signals are time-reversed.

3. The method as claimed in claim 2 in which the said time-reversed free induction decay signals and the non time-reversed free induction decay signals are subject to Fourier transformation.

4. The method as claimed in claim 1 in which the said step of exciting nuclear spins in a selected plane comprises applying the second gradient of the magnetic field with a gradient reversed with respect to step (2) together with a 90° rf pulse.

5. The method as claimed in claim 1 and including a prior step of inverting the nuclear spins in the selected plane.

6. The method as claimed in claim 5 in which inverting the nuclear spins is achieved by applying a 180° rf pulse.

7. The method as claimed in claim 5 in which inverting the nuclear spins is achieved by an adiabatic fast passage.

8. The method as claimed in claim 5 in which a time interval is interposed between the said prior step and step (1).

9. The method as claimed in claim 8 in which the said time interval is approximately equal to the spin-lattice relaxation time of protons in the object.

10. The method as claimed in any one of the preceding claims in which the sequence of steps is repeated for different selected planes.

11. The method as claimed in claim 10 in which the selected planes are parallel to each other.

12. The method as claimed in claim 11 in which the selected planes are parallel to the said axis.

* * * * *